(12) United States Patent
Noh et al.

(10) Patent No.: US 12,387,980 B2
(45) Date of Patent: Aug. 12, 2025

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Sun Young Noh, Hwaseong-si (KR); Eui Bok Lee, Seoul (KR); Wan Don Kim, Seongnam-si (KR); Han Min Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 839 days.

(21) Appl. No.: 17/592,629

(22) Filed: Feb. 4, 2022

(65) Prior Publication Data

US 2023/0026976 A1    Jan. 26, 2023

(30) Foreign Application Priority Data

Jul. 21, 2021 (KR) .................. 10-2021-0095436

(51) Int. Cl.
*H01L 21/768* (2006.01)
*H01L 23/522* (2006.01)
*H01L 23/532* (2006.01)

(52) U.S. Cl.
CPC .. *H01L 21/76877* (2013.01); *H01L 21/76832* (2013.01); *H01L 21/76843* (2013.01); *H01L 23/5226* (2013.01); *H01L 23/53238* (2013.01)

(58) Field of Classification Search
CPC ......... H01L 21/76877; H01L 21/76844; H01L 21/76843; H01L 21/76829
See application file for complete search history.

(56) References Cited

U.S. PATENT DOCUMENTS

| | | | |
|---|---|---|---|
| 6,433,428 B1 * | 8/2002 | Watanabe | ......... H01L 23/53257 257/E21.585 |
| 7,332,428 B2 | 2/2008 | Beck | |
| 8,384,220 B2 | 2/2013 | Saito et al. | |

(Continued)

FOREIGN PATENT DOCUMENTS

| KR | 10-0643853 | 11/2006 |
|---|---|---|
| KR | 10-2016-0066899 | 6/2016 |

(Continued)

*Primary Examiner* — Wael M Fahmy
*Assistant Examiner* — Fernando Jose Ramos-Diaz
(74) *Attorney, Agent, or Firm* — Morgan, Lewis & Bockius LLP

(57) ABSTRACT

A semiconductor device includes: a substrate; a first interlayer insulating layer on the substrate; a first wiring pattern in a first trench of the first interlayer insulating layer; a second interlayer insulating layer on the first interlayer insulating layer; a second wiring pattern in a second trench of the second interlayer insulating layer; a third interlayer insulating layer on the second interlayer insulating layer; a third wiring pattern in a third trench of the third interlayer insulating layer, and including a wiring barrier layer and a wiring filling layer, wherein the wiring filling layer contacts the third interlayer insulating layer; a via trench extending from the first wiring pattern to the third trench; and a via including a via barrier layer and a via filling layer. The via barrier layer is in the via trench. The via filling layer contacts the first wiring pattern and the wiring filling layer.

16 Claims, 17 Drawing Sheets

(56) References Cited

U.S. PATENT DOCUMENTS

| | | | |
|---|---|---|---|
| 9,330,974 B2 * | 5/2016 | Kim ..................... | H01L 23/485 |
| 9,659,856 B2 | 5/2017 | Lee et al. | |
| 2004/0130035 A1 * | 7/2004 | Wu ................... | H01L 21/76831 |
| | | | 257/E21.583 |
| 2005/0181559 A1 * | 8/2005 | Natori .................... | H10B 53/30 |
| | | | 257/E21.664 |
| 2019/0363048 A1 | 11/2019 | Zhao et al. | |
| 2020/0135640 A1 | 4/2020 | Sio et al. | |

FOREIGN PATENT DOCUMENTS

| | | |
|---|---|---|
| KR | 10-2019-0064400 | 6/2019 |
| KR | 10-2021-0038836 | 4/2021 |

* cited by examiner

SEMICONDUCTOR DEVICE AND METHOD FOR FABRICATING THE SAME

CROSS REFERENCE TO RELATED APPLICATION

This application claims priority under 35 U.S.C. § 119 to Korean Patent Applications No. 10-2021-0095436 filed on Jul. 21, 2021 in the Korean Intellectual Property Office, the disclosure of which is incorporated by reference herein in its entirety.

TECHNICAL FIELD

The present inventive concept relates to a semiconductor device and a method for fabricating the same.

DISCUSSION OF THE RELATED ART

As down-scaling of semiconductor elements has progressed rapidly in recent years due to development of electronic technology, high integration and low power consumption of semiconductor chips have been desired. With increased integration in semiconductor chips, gaps between circuit components, such as wirings, have gradually decreased, which may result in increased resistance between circuit components, such as the wiring and a via.

SUMMARY

According to an exemplary embodiment of the present inventive concept, a semiconductor device includes: a substrate; a first interlayer insulating layer disposed on the substrate; a first wiring pattern disposed in a first trench formed in the first interlayer insulating layer; a second interlayer insulating layer disposed on the first interlayer insulating layer; a second wiring pattern disposed in a second trench formed in the second interlayer insulating layer; a third interlayer insulating layer disposed on the second interlayer insulating layer; a third wiring pattern disposed in a third trench formed in the third interlayer insulating layer, and including a first wiring barrier layer and a first wiring filling layer, wherein the first wiring barrier layer is disposed along side walls of the third trench, wherein the first wiring filling layer fills the third trench and is disposed on the first wiring barrier layer, wherein a bottom surface of the first wiring filling layer is in contact with the third interlayer insulating layer; a first via trench extending from an upper surface of the first wiring pattern to a bottom surface of the third trench in a first direction; and a first via including a first via barrier layer and a first via filling layer, wherein the first via barrier layer is disposed along side walls of the first via trench, wherein the first via filling layer fills the first via trench and is disposed on the first via barrier layer, wherein the first via filling layer is in contact with each of the first wiring pattern and the first wiring filling layer, wherein the first wiring filling layer and the first via filling layer include different materials from each other.

According to an exemplary embodiment of the present inventive concept, a semiconductor device includes: a substrate; a first interlayer insulating layer disposed on the substrate; a first wiring pattern disposed in a first trench formed in the first interlayer insulating layer; a first etching stop layer disposed on the first interlayer insulating layer; a second interlayer insulating layer disposed on the first etching stop layer; a second etching stop layer disposed on the second interlayer insulating layer; a third interlayer insulating layer disposed on the second etching stop layer; a second wiring pattern disposed in a second trench formed in the third interlayer insulating layer, and including a wiring barrier layer, a liner layer, and a filling layer, wherein the wiring barrier layer is disposed along side walls of the second trench, wherein the liner layer is disposed along side walls of the wiring barrier layer and a bottom surface of the second trench, wherein the filling layer fills the second trench and is disposed on the liner layer, and wherein the liner layer is in contact with the third interlayer insulating layer; a via trench extending from an upper surface of the first wiring pattern to the bottom surface of the second trench in a vertical direction; and a via including a via barrier layer and a via filling layer, wherein the via barrier layer is disposed along side walls of the via trench, wherein the via filling layer fills the via trench and is disposed on the via barrier layer, and wherein the via filling layer is in contact with each of the first wiring pattern and the filling layer, wherein the filling layer and the via filling layer include different materials from each other.

According to an exemplary embodiment of the present inventive concept, a method for fabricating a semiconductor device includes: forming a first interlayer insulating layer on a substrate; forming a first wiring pattern in a first trench formed in the first interlayer insulating layer; forming a second interlayer insulating layer on the first interlayer insulating layer; forming a second wiring pattern in a second trench formed in the second interlayer insulating layer; forming a third interlayer insulating layer on the second interlayer insulating layer; forming a third trench in the third interlayer insulating layer; forming a via trench extending from a bottom surface of the third trench to an upper surface of the first wiring pattern; forming a wiring barrier layer along side walls and the bottom surface of the third trench; forming a via barrier layer along side walls and a bottom surface of the via trench; removing the wiring barrier layer formed on the bottom surface of the third trench and the via barrier layer formed on the bottom surface of the via trench; forming a via filling layer on the via barrier layer and filling the via trench; forming a liner layer along side walls of the wiring barrier layer and the bottom surface of the third trench; and forming a filling layer on the liner layer and the via filling layer to fill the third trench, wherein the filling layer is in contact with the via filling layer.

BRIEF DESCRIPTION OF THE DRAWINGS

The above and other features of the present inventive concept will become more apparent by describing in detail exemplary embodiments thereof, with reference to the attached drawings, in which.

DETAILED DESCRIPTION OF THE EMBODIMENTS

Figure 1:
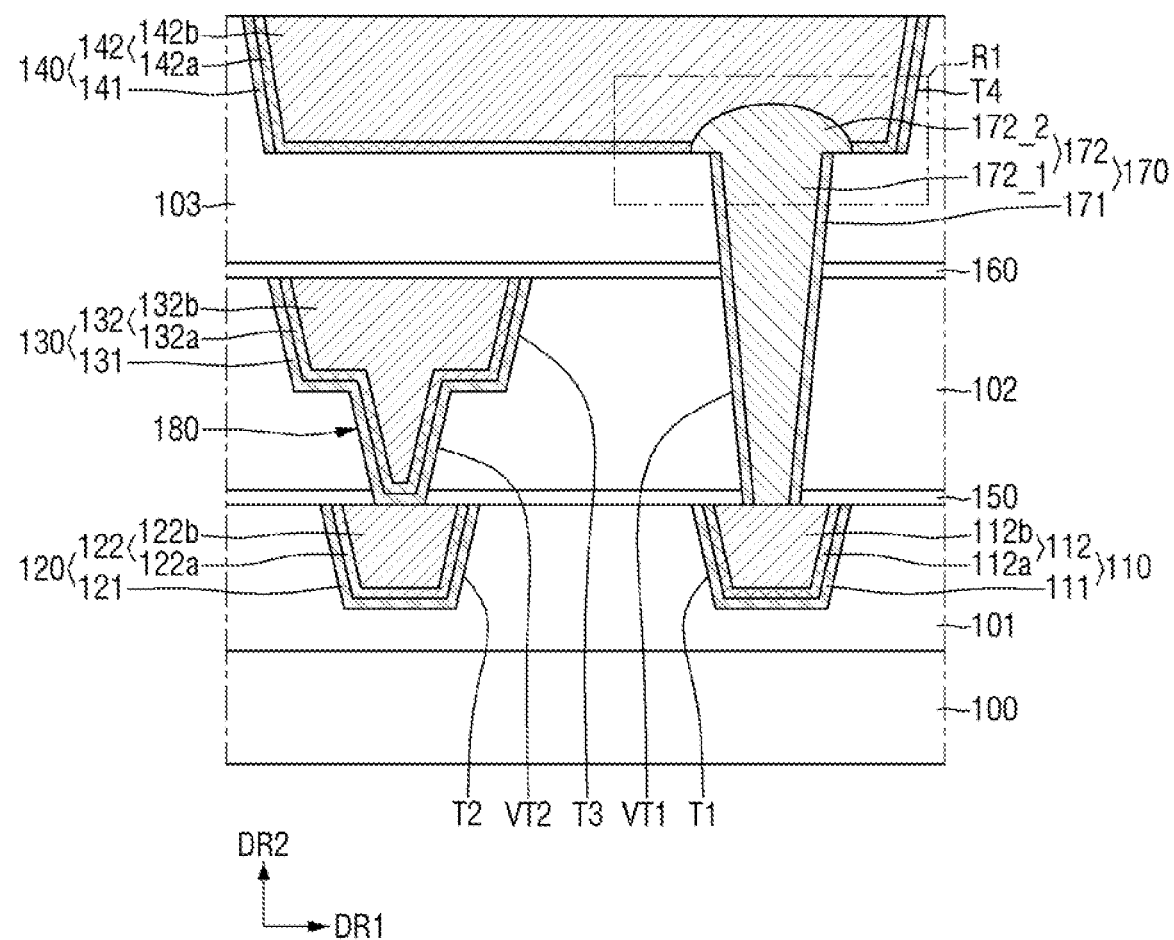
FIG. 1 is a diagram illustrating a semiconductor device according to an exemplary embodiment of the present inventive concept.

Hereinafter, a semiconductor device according to an exemplary embodiment of the present inventive concept will be described with reference to FIGS. 1 and 2. In the drawings, like reference numerals may refer to like elements.

FIG. 1 is a diagram illustrating a semiconductor device according to an exemplary embodiment of the present inventive concept. FIG. 2 is an enlarged view of a region R1 of FIG. 1.

Figure 2:
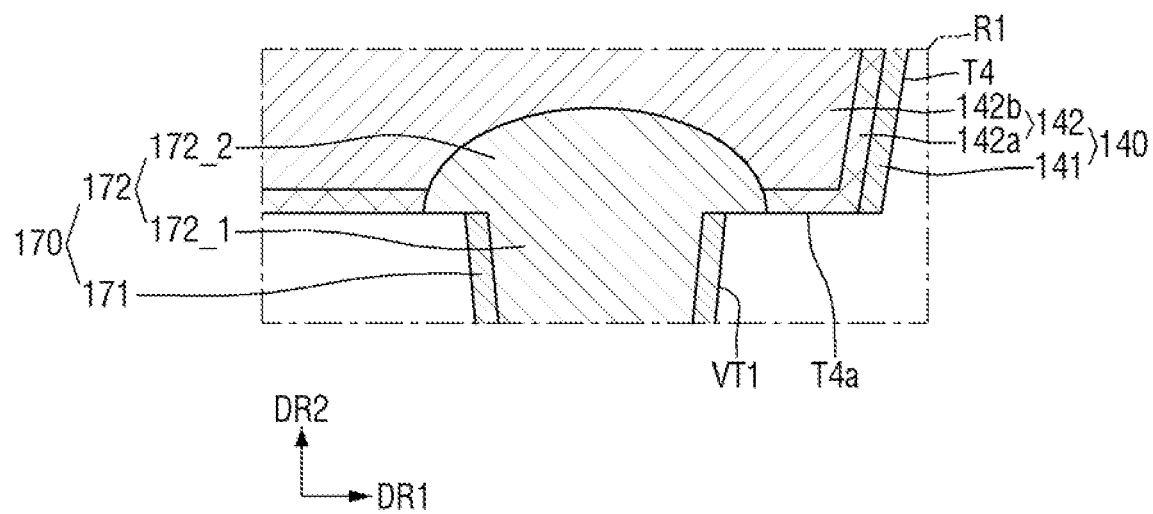
FIG. 2 is an enlarged view of a region R1 of FIG. 1.

Referring to FIGS. 1 and 2, the semiconductor device according to an exemplary embodiment of the present inventive concept includes a substrate 100, a first interlayer insulating layer 101, a second interlayer insulating layer 102, a third interlayer insulating layer 103, a first wiring pattern 110, a second wiring pattern 120, a third wiring pattern 130, a fourth wiring pattern 140, a first etching stop layer 150, a second etching stop layer 160, a first via 170, and a second via 180.

Although the substrate 100 may have a structure in which a base substrate and an epitaxial layer are stacked, the present inventive concept is not limited thereto. For example, the substrate 100 may be a silicon substrate, a gallium arsenide substrate, a silicon germanium substrate, a ceramic substrate, a quartz substrate, a display glass substrate, or the like, or may be an SOI (Semiconductor On Insulator) substrate.

In addition, although not shown, the substrate 100 may include a conductive pattern. Although the conductive pattern may be a metal wiring, a contact, or the like, and may be a gate electrode of a transistor, a source/drain of a transistor, a diode, or the like, the present inventive concept is not limited to.

The first interlayer insulating layer 101 may be disposed on the substrate 100. The first interlayer insulating layer 101 may include, for example, at least one of silicon oxide, silicon nitride, silicon oxynitride and a low dielectric constant material. The first interlayer insulating layer 101 may include a low dielectric constant material to reduce a coupling shape between the wirings.

A first trench T1 may be formed inside the first interlayer insulating layer 101. For example, the first trench T1 may extend from the upper surface of the first interlayer insulating layer 101 toward the substrate 100 in a vertical direction DR2. For example, a bottom surface of the first trench T1 may be formed inside the first interlayer insulating layer 101. However, the present inventive concept is not limited thereto. For example, the bottom surface of the first trench T1 may be coplanar with the bottom surface of the first interlayer insulating layer 101.

Side walls of the first wiring pattern 110 may be surrounded by the first interlayer insulating layer 101. The first wiring pattern 110 may be disposed inside the first trench T1. The first wiring pattern 110 may include a first wiring barrier layer 111 and a first wiring filling layer 112.

The first wiring barrier layer 111 may be disposed along the side walls and the bottom surface of the first trench T1. The first wiring barrier layer 111 may be formed, for example, conformally. The first wiring barrier layer 111 may include, for example, one of titanium (Ti), titanium nitride (TIN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and combinations thereof. However, the present inventive concept is not limited thereto.

The first wiring filling layer 112 may fill the first trench T1 and may be disposed on the first wiring barrier layer 111. For example, the first wiring filling layer 112 may include a plurality of layers. For example, the first wiring filling layer 112 may include a first liner layer 112a and a first filling layer 112b.

The first liner layer 112a may be disposed on the first wiring barrier layer 111 inside the first trench T1. For example, the first liner layer 112a may be conformally disposed on the first wiring barrier layer 111. The first liner layer 112a may include, for example, at least one of cobalt (Co), ruthenium (Ru) and/or tantalum (Ta). However, the present inventive concept is not limited thereto.

The first filling layer 112b may fill the first trench T1 and may be disposed on the first liner layer 112a. The first filling layer 112b may include, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), tungsten (W), ruthenium (Ru), iridium (Ir), and/or rhodium (Rh). However, the present inventive concept is not limited thereto.

The second trench T2 may be formed inside the first interlayer insulating layer 101. For example, the second trench T2 may extend from the upper surface of the first interlayer insulating layer 101 toward the substrate 100 in the vertical direction DR2. For example, the bottom surface of the second trench T2 may be formed inside the first interlayer insulating layer 101. The second trench T2 may be spaced apart from the first trench T1 in a horizontal direction DR1. However, the present inventive concept is not limited thereto. For example, the bottom surface of the second trench T2 may be coplanar with the bottom surface of the first interlayer insulating layer 101.

The side walls of the second wiring pattern 120 may be surrounded by the first interlayer insulating layer 101. The second wiring pattern 120 may be disposed inside the second trench T2. The second wiring pattern 120 may be spaced apart from the first wiring pattern 110 in the horizontal direction DR1. For example, the first interlayer insulating layer 101 is between the first wiring pattern 110 and the second wiring pattern 120. The second wiring pattern 120 may include a second wiring barrier layer 121 and a second wiring filling layer 122.

The second wiring barrier layer 121 may be disposed along the side walls and bottom surface of the second trench T2. The second wiring barrier layer 121 may be formed, for example, conformally. For example, the second wiring barrier layer 121 may include the same material as the first wiring barrier layer 111.

The second wiring filling layer 122 may fill the second trench T2 and may be disposed on the second wiring barrier layer 121. For example, the second wiring filling layer 122 may include a plurality of layers. For example, the second wiring filling layer 122 may include a second liner layer 122a and a second filling layer 122b.

The second liner layer 122a may be disposed on the second wiring barrier layer 121 inside the second trench T2. For example, the second liner layer 122a may be conformally disposed on the second wiring barrier layer 121. For example, the second liner layer 122a may include the same material as the first liner layer 112a. The second filling layer 122b may fill the second trench T2 and may be disposed on the second liner layer 122a. For example, the second filling layer 122b may include the same material as the first filling layer 112b.

The first etching stop layer 150 may be disposed on the first interlayer insulating layer 101. The first etching stop layer 150 may cover a part of the upper surfaces of each of the first wiring pattern 110 and the second wiring pattern 120. Although FIG. 1 shows that the first etching stop layer 150 is formed of a single film, the present inventive concept is not limited thereto. In an exemplary embodiment of the present inventive concept, the first etching stop layer 150 may include a plurality of layers.

The first etching stop layer 150 may include, for example, silicon nitride, silicon oxynitride, silicon carbon nitride, and the like. In an exemplary embodiment of the present inventive concept, the first etching stop layer 150 may include a metal, for example, aluminum (Al). However, the present inventive concept is not limited thereto.

The second interlayer insulating layer 102 may be disposed on the first etching stop layer 150. The second interlayer insulating layer 102 may include, for example, at least one of silicon oxide, silicon nitride, silicon oxynitride and/or a low dielectric constant material. The second interlayer insulating layer 102 may include a low dielectric constant material to reduce the coupling shape between the wirings (e.g., 130 and 140).

The third trench T3 may be formed inside the second interlayer insulating layer 102. For example, the third trench T3 may extend from the upper surface of the second interlayer insulating layer 102 toward the substrate 100 in the vertical direction DR2. For example, the bottom surface of the third trench T3 may be formed inside the second interlayer insulating layer 102.

The second via trench VT2 may extend from the upper surface of the second wiring pattern 120 to the bottom surface of the third trench T3 in the vertical direction DR2. A width of the upper surface of the second via trench VT2 in the horizontal direction DR1 may be smaller than a width of the bottom surface of the third trench T3 in the horizontal direction DR1. Further, a width of the bottom surface of the second via trench VT2 in the horizontal direction DR1 may be smaller than the width of the upper surface of the second trench T2 in the horizontal direction DR1.

The side walls of the third wiring pattern 130 may be surrounded by the second interlayer insulating layer 102. The third wiring pattern 130 may be disposed inside the third trench T3. The side walls of the second via 180 may be surrounded by each of the second interlayer insulating layer 102 and the first etching stop layer 150. The second via 180 may be disposed inside the second via trench VT2. Each of the third wiring pattern 130 and the second via 180 may include a third wiring barrier layer 131 and a third wiring filling layer 132.

The third wiring barrier layer 131 may be disposed along the side walls and bottom surfaces of each of the third trench T3 and the second via trench VT2. The third wiring barrier layer 131 may be formed, for example, conformally in the third trench T3 and the second via trench VT2. For example, the third wiring barrier layer 131 may include the same material as the first wiring barrier layer 111.

The third wiring filling layer 132 may fill each of the third trench T3 and the second via trench VT2, and may be disposed on the third wiring barrier layer 131. For example, the third wiring filling layer 132 may include a plurality of layers. For example, the third wiring filling layer 132 may include a third liner layer 132a and a third filling layer 132b.

The third liner layer 132a may be disposed on the third wiring barrier layer 131 inside each of the third trench T3 and the second via trench VT2. For example, the third liner layer 132a may be conformally disposed on the third wiring barrier layer 131. For example, the third liner layer 132a may include the same material as the first liner layer 112a. The third filling layer 132b may fill each of the third trench T3 and the second via trench VT2, and may be disposed on the third liner layer 132a. For example, the third filling layer 132b may include the same material as the first filling layer 112b.

The second etching stop layer 160 may be disposed on the second interlayer insulating layer 102. For example, the second etching stop layer 160 may cover at least a part of the upper surface of the third wiring pattern 130. Although FIG. 1 shows that the second etching stop layer 160 is formed of a single film, the present inventive concept is not limited thereto. In an exemplary embodiment of the present inventive concept, the second etching stop layer 160 may include a plurality of layers.

The second etching stop layer 160 may include, for example, silicon nitride, silicon oxynitride, silicon carbon nitride, and the like. In an exemplary embodiment of the present inventive concept, the second etching stop layer 160 may include a metal, for example, aluminum (Al). However, the present inventive concept is not limited thereto.

The third interlayer insulating layer 103 may be disposed on the second etching stop layer 160. The third interlayer insulating layer 103 may include, for example, at least one of silicon oxide, silicon nitride, silicon oxynitride and/or a low dielectric constant material. The third interlayer insulating layer 103 may include a low dielectric constant material to reduce the coupling shape between the wirings.

A fourth trench T4 may be formed inside the third interlayer insulating layer 103. For example, the fourth trench T4 may extend from the upper surface of the third interlayer insulating layer 103 toward the substrate 100 in the vertical direction DR2. For example, a bottom surface T4a of the fourth trench T4 may be formed inside the third interlayer insulating layer 103.

The side walls of the fourth wiring pattern 140 may be surrounded by the third interlayer insulating layer 103. The fourth wiring pattern 140 may be disposed inside the fourth trench T4. The fourth wiring pattern 140 may include a fourth wiring barrier layer 141 and a fourth wiring filling layer 142.

The fourth wiring barrier layer 141 may be disposed along the side walls of the fourth trench T4. For example, the fourth wiring barrier layer 141 is not disposed on the bottom surface of the fourth trench T4. However, the present inventive concept is not limited thereto. For example, the fourth wiring barrier layer 141 may be disposed on a portion of the bottom surface of the fourth trench T4. The fourth wiring barrier layer 141 may be formed, for example, conformally.

The fourth wiring barrier layer 141 may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), and combinations thereof. However, the present inventive concept is not limited thereto.

The fourth wiring filling layer 142 may fill the fourth trench T4 and may be disposed on the fourth wiring barrier layer 141. For example, the fourth wiring filling layer 142 may include a plurality of layers. For example, the fourth wiring filling layer 142 may include a fourth liner layer 142a and a fourth filling layer 142b.

A bottom surface of the fourth wiring filling layer 142 may be in contact with the third interlayer insulating layer 103. For example, a part of the bottom surface of the fourth wiring filling layer 142 may be in contact with the third interlayer insulating layer 103 on both sides of the first via 170.

The fourth liner layer 142a may be disposed inside the fourth trench T4 along the side walls of the fourth wiring barrier layer 141 and the bottom surface of the fourth trench T4. For example, the fourth liner layer 142a may be in contact with the third interlayer insulating layer 103 on both sides of the first via 170. For example, the fourth liner layer 142a may be conformally disposed in the fourth trench T4. The fourth liner layer 142a may include, for example, at least one of cobalt (Co), ruthenium (Ru) and/or tantalum (Ta). However, the present inventive concept is not limited thereto.

The fourth filling layer 142b may fill the fourth trench T4 and may be disposed on the fourth liner layer 142a. The fourth filling layer 142b may include, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), tungsten (W), ruthenium (Ru), iridium (Ir), and/or rhodium (Rh). However, the present disclosure is not limited thereto.

The first via trench VT1 may extend from the upper surface of the first wiring pattern 110 to the bottom surface of the fourth trench T4 in the vertical direction DR2. The first via trench VT1 may penetrate the first etching stop layer 150, the second interlayer insulating layer 102, the second etching stop layer 160, and a part of the third interlayer insulating layer 103 in the vertical direction DR2.

A width of the upper surface of the first via trench VT1 in the horizontal direction DR1 may be smaller than a width of the bottom surface T4a of the fourth trench T4 in the horizontal direction DR1. Further, the width of the bottom surface of the first via trench VT1 in the horizontal direction DR1 may be smaller than the width of the upper surface of the first trench T1 in the horizontal direction DR1.

The side walls of the first via 170 may be surrounded by each of the first etching stop layer 150, the second interlayer insulating layer 102, the second etching stop layer 160, and the third interlayer insulating layer 103. The first via 170 may be disposed inside the first via trench VT1. A part of the first via 170 may protrude into the fourth trench T4. For example, the upper surface of a part of the first via 170 protruding into the fourth trench T4 may be formed to be higher than the bottom surface T4a of the fourth trench T4. For example, the upper surface of the part of the first via 170 protruding into the fourth trench T4 may protrude beyond the bottom surface T4a of the fourth trench. The first via 170 may be spaced apart from the third wiring pattern 130 in the horizontal direction DR1.

The first via 170 may include a first via barrier layer 171 and a first via filling layer 172. The first via barrier layer 171 may be disposed along the side walls of the first via trench VT1. For example, the first via barrier layer 171 may be conformally disposed in the first via trench VT1. For example, the first via barrier layer 171 may include the same material as the fourth wiring barrier layer 141. The first via barrier layer 171 may include, for example, at least one of cobalt (Co), ruthenium (Ru) and/or tantalum (Ta). However, the present inventive concept is not limited thereto.

The first via filling layer 172 may fill the first via trench VT1 and may be disposed on the first via barrier layer 171. A part of the first via filling layer 172 may be disposed inside the fourth trench T4. The first via filling layer 172 may include a first portion 172_1 disposed inside the first via trench VT1, and a second portion 172_2 disposed inside the fourth trench T4. The second portion 172_2 of the first via filling layer 172 may be a portion protruding into the fourth trench T4. The bottom surface of the first portion 172_1 of the first via filling layer 172 may be in contact with the first wiring pattern 110. For example, the bottom surface of the first portion 172_1 of the first via filling layer 172 may be in direct contact with the first wiring pattern 110. The upper surface of the second portion 172_2 of the first via filling layer 172 may be in contact with the fourth filling layer 142b. For example, the upper surface of the second portion 172_2 of the first via filling layer 172 may be in direct contact with the fourth filling layer 142b.

At least a part of the second portion 172_2 of the first via filling layer 172 may protrude beyond the first portion 172_1 of the first via filling layer 172 in the horizontal direction DR1. For example, the part of the second portion 172_2 of the first via filling layer 172 may protrude beyond side surfaces of the first portion 172_1 of the first via filling layer 172 in the horizontal direction DR1. A bottom surface of a part of the second portion 172_2 of the first via filling layer 172 protruding beyond the first portion 172_1 of the first via filling layer 172 in the horizontal direction DR1 may be in contact with each of an uppermost surface of the first via barrier layer 171 and the third interlayer insulating layer 103.

A width of the bottom surface of the second portion 172_2 of the first via filling layer 172 in the horizontal direction DR1 may be greater than a width of the upper surface (or, e.g., an upper portion) of the first portion 172_1 of the first via filling layer 172 in the horizontal direction DR1.

The first via filling layer 172 may include, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), tungsten (W), ruthenium (Ru), iridium (Ir), and/or rhodium (Rh). However, the present inventive concept is not limited thereto. The first via filling layer 172 may include a material different from the fourth filling layer 142b. For example, the fourth filling layer 142b may include copper (Cu), and the first via filling layer 172 may include tungsten (W).

In the semiconductor device according to an exemplary embodiment of the present inventive concept, because the first via filling layer 172 included in the first via 170 is formed to be in contact with the first (e.g., lower) wiring pattern 110, the resistance between the first via 170 and the first wiring pattern 110 can be reduced. Further, in the semiconductor device according to an exemplary embodiment of the present inventive concept, because the first via filling layer 172 included in the first via 170 is formed to be in contact with the fourth filling layer 142b included in the fourth (e.g., upper) wiring pattern 140, the resistance between the first via 170 and the fourth wiring pattern 140 can be reduced.

Hereinafter, a method for fabricating a semiconductor device according to an exemplary embodiment of the present inventive concept will be described with reference to FIGS. 1, 3 to 11.

FIGS. 3 to 11 are intermediate stage diagrams illustrating a method for fabricating a semiconductor device according to an exemplary embodiment of the present inventive concept.

Figure 3:
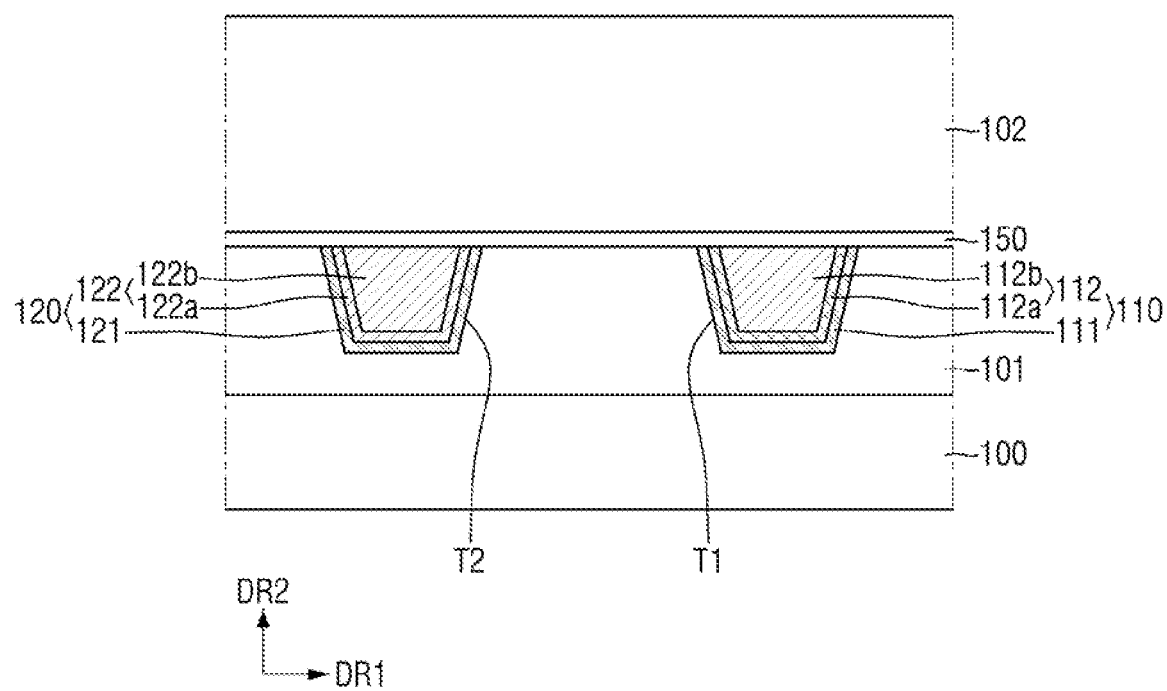
FIGS. 3, 4, 5, 6, 7, 8, 9, 10 and 11 are intermediate stage diagrams illustrating a method for fabricating a semiconductor device according to an exemplary embodiment of the present inventive concept.

Referring to FIG. 3, the first interlayer insulating layer 101 may be formed on the substrate 100. Subsequently, a first trench T1 and a second trench T2 may be formed inside the first interlayer insulating layer 101 to be spaced apart from each other in the horizontal direction DR1. Subsequently, the first wiring pattern 110 may be formed inside the first trench T1, and the second wiring pattern 120 may be formed inside the second trench T2.

The first wiring pattern 110 may include a first wiring barrier layer 111, a first liner layer 112a, and a first filling layer 112b. The first wiring barrier layer 111 may be formed along the side walls and the bottom surface of the first trench T1, and the first liner layer 112a may be formed on the first wiring barrier layer 111. The first filling layer 112b may be formed to fill the first trench T1 and may be disposed on the first liner layer 112a.

The second wiring pattern 120 may include a second wiring barrier layer 121, a second liner layer 122a, and a second filling layer 122b. The second wiring barrier layer 121 may be formed along the side walls and the bottom surface of the second trench T2, and the second liner layer 122a may be formed on the second wiring barrier layer 121. The second filling layer 122b may be formed to fill the second trench T2 and may be disposed on the second liner layer 122a.

Subsequently, the first etching stop layer 150 and the second interlayer insulating layer 102 may be formed sequentially on the first interlayer insulating layer 101, the upper surface of the first wiring pattern 110 and the upper surface of the second wiring pattern 120.

Figure 4:
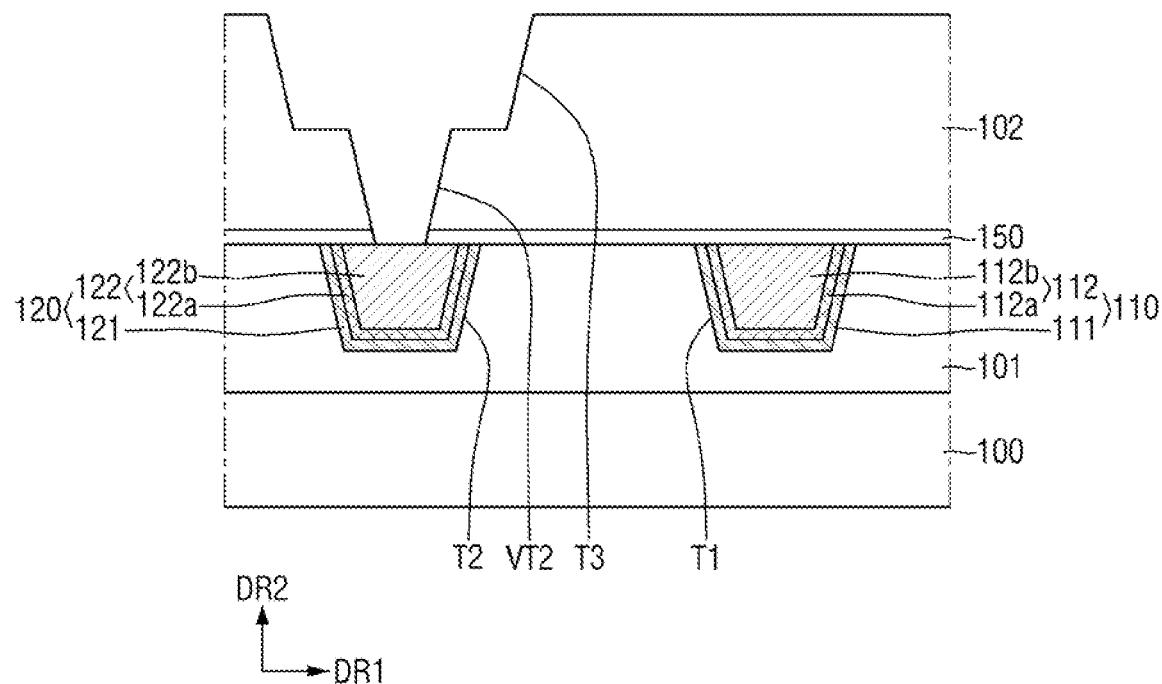

Referring to FIG. 4, a third trench T3 may be formed inside the second interlayer insulating layer 102 and may penetrate the second interlayer insulating layer 102. Subsequently, a second via trench VT2 extending from the bottom surface of the third trench T3 to the upper surface of the second wiring pattern 120 may be formed. A width of the upper surface of the second via trench VT2 in the horizontal direction DR1 may be formed to be smaller than a width of the bottom surface of the third trench T3 in the horizontal direction DR1.

Figure 5:
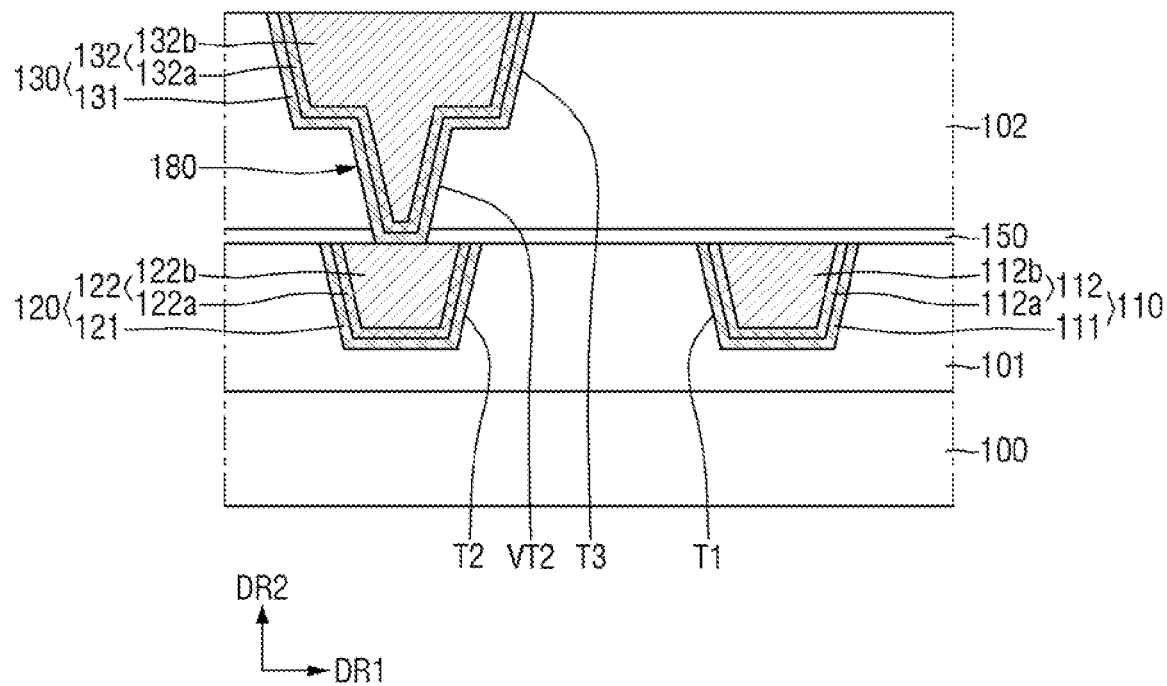

Referring to FIG. 5, a third wiring pattern 130 may be formed inside the third trench T3. Further, a second via 180 may be formed inside the second via trench VT2. The third wiring pattern 130 and the second via 180 may be formed through the same fabricating process. However, the present inventive concept is not limited thereto. For example, the third wiring pattern 130 and the second via 180 may be formed through separate fabricating processes.

The third wiring pattern 130 and the second via 180 may include a third wiring barrier layer 131, a third liner layer 132a, and a third filling layer 132b. The third wiring barrier layer 131 may be formed along the side walls and the bottom surface of each of the third trench T3 and the second via trench VT2, and the third liner layer 132a may be formed on the third wiring barrier layer 131. The third filling layer 132b may be formed to fill each of the third trench T3 and the second via trench VT2 and may be disposed on the third liner layer 132a.

Figure 6:
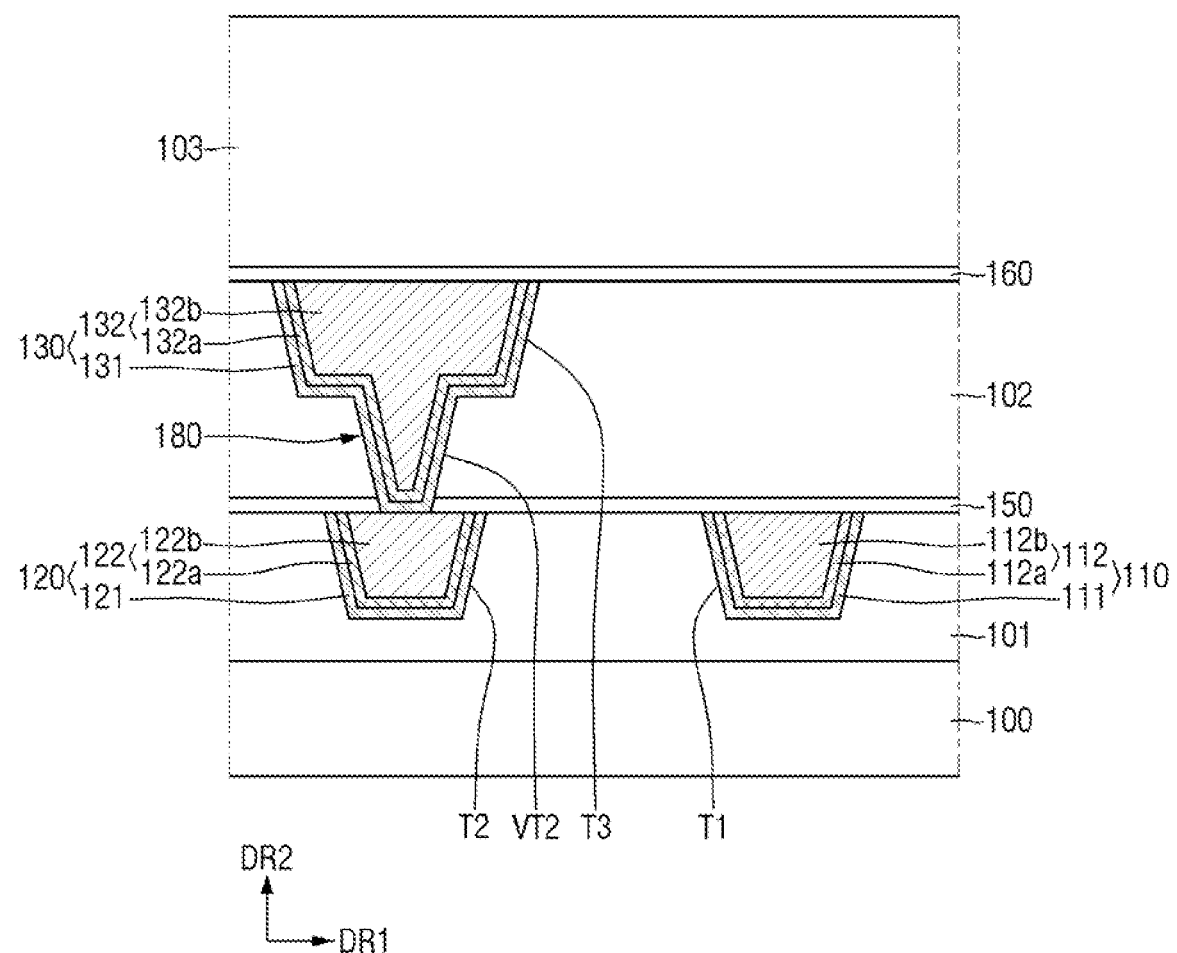

Referring to FIG. 6, the second etching stop layer 160 and the third interlayer insulating layer 103 may be sequentially formed on the upper surfaces of the second interlayer insulating layer 102 and the third wiring pattern 130.

Figure 7:
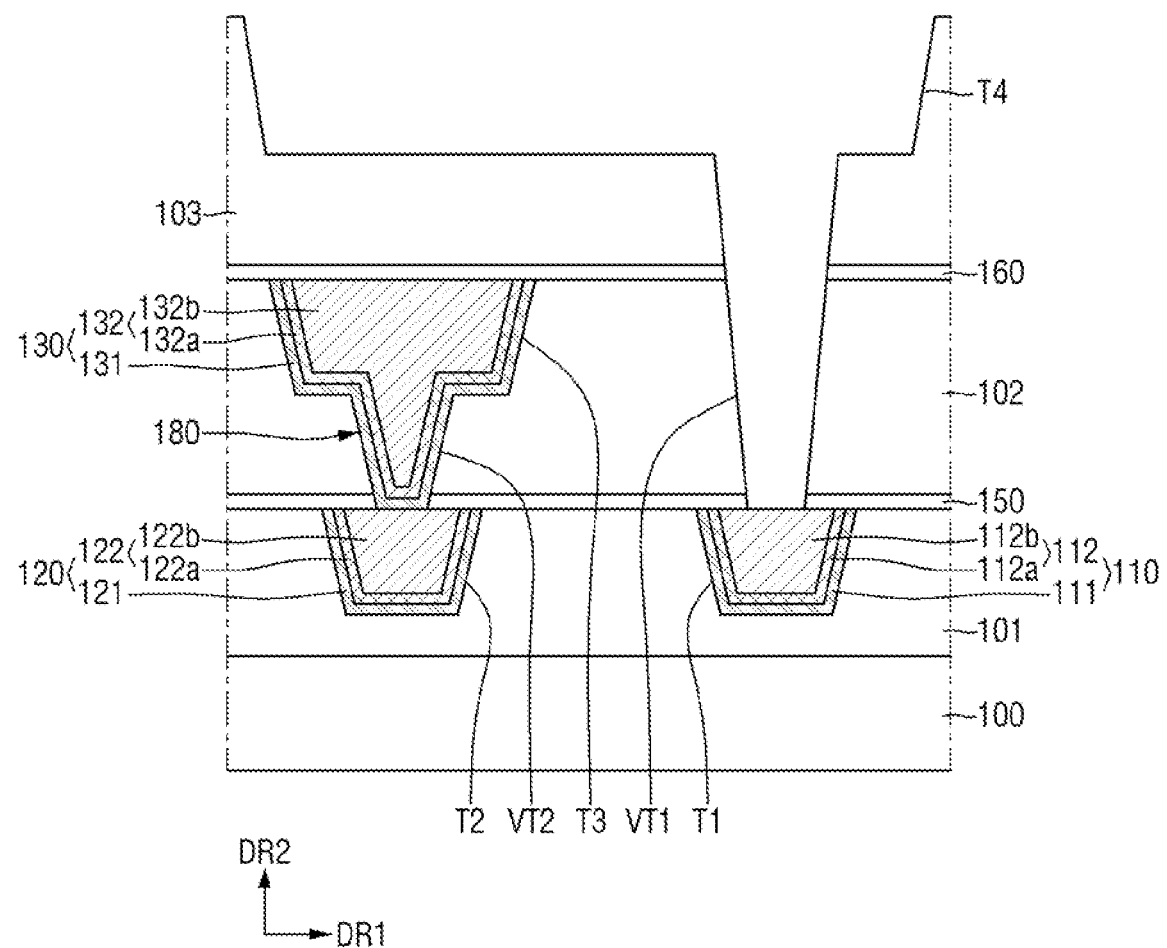

Referring to FIG. 7, a fourth trench T4 may be formed inside the third interlayer insulating layer 103. Subsequently, a first via trench VT1 extending from the bottom surface of the fourth trench T4 to the upper surface of the first wiring pattern 110 may be formed. The first via trench VT1 may be formed to penetrate the first etching stop layer 150, the second interlayer insulating layer 102, the second etching stop layer 160, and a part of the third interlayer insulating layer 103 in the vertical direction DR2. A width of the upper surface of the first via trench VT1 in the horizontal direction DR1 may be smaller than the width of the bottom surface of the fourth trench T4 in the horizontal direction DR1.

Figure 8:
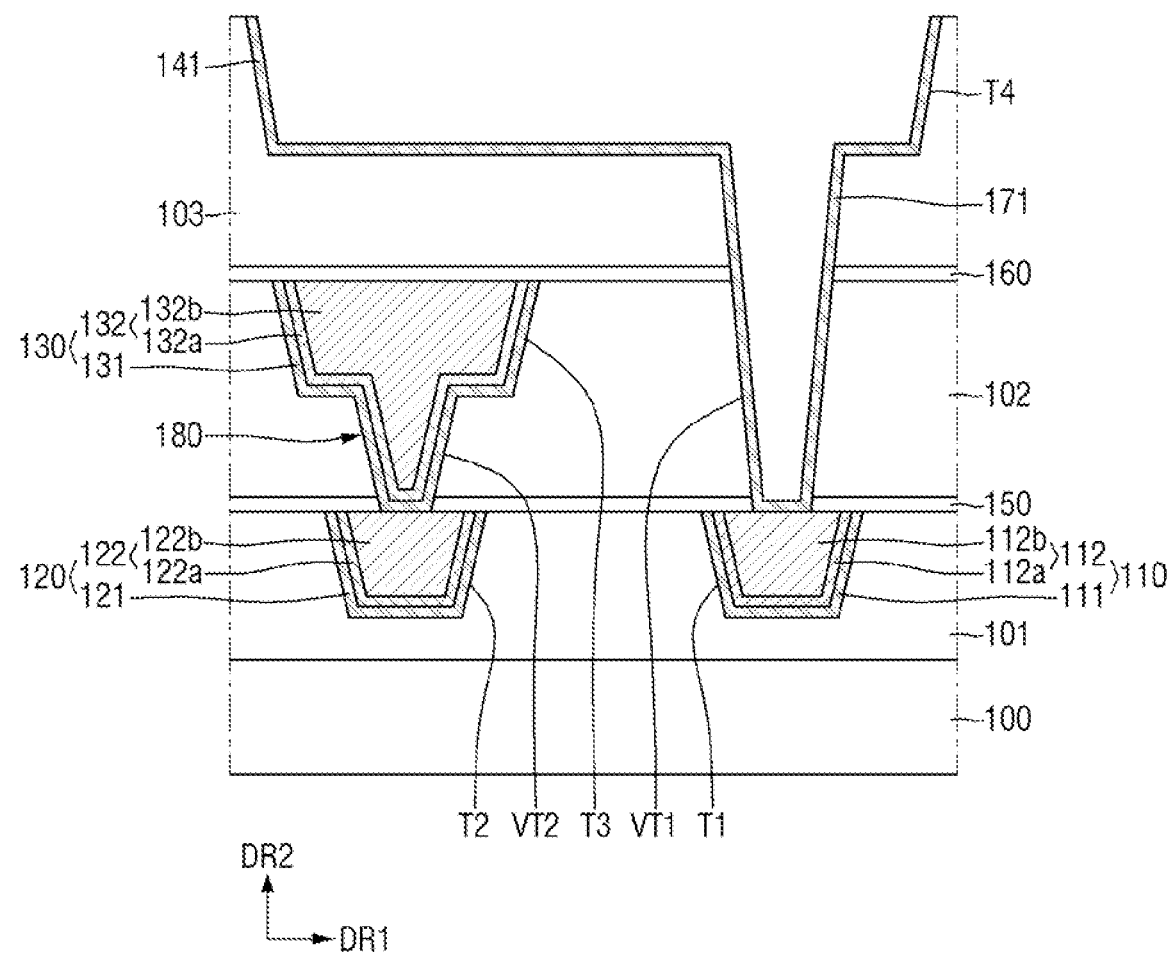

Referring to FIG. 8, a fourth wiring barrier layer 141 may be formed along the side walls and bottom surface of the fourth trench T4. Further, a first via barrier layer 171 may be formed along the side walls and bottom surface of the first via trench VT1. For example, the fourth wiring barrier layer 141 may contact the first wiring pattern 110. The fourth wiring barrier layer 141 and the first via barrier layer 171 may include the same material. The fourth wiring barrier layer 141 and the first via barrier layer 171 may be formed through the same fabricating process.

Figure 9:
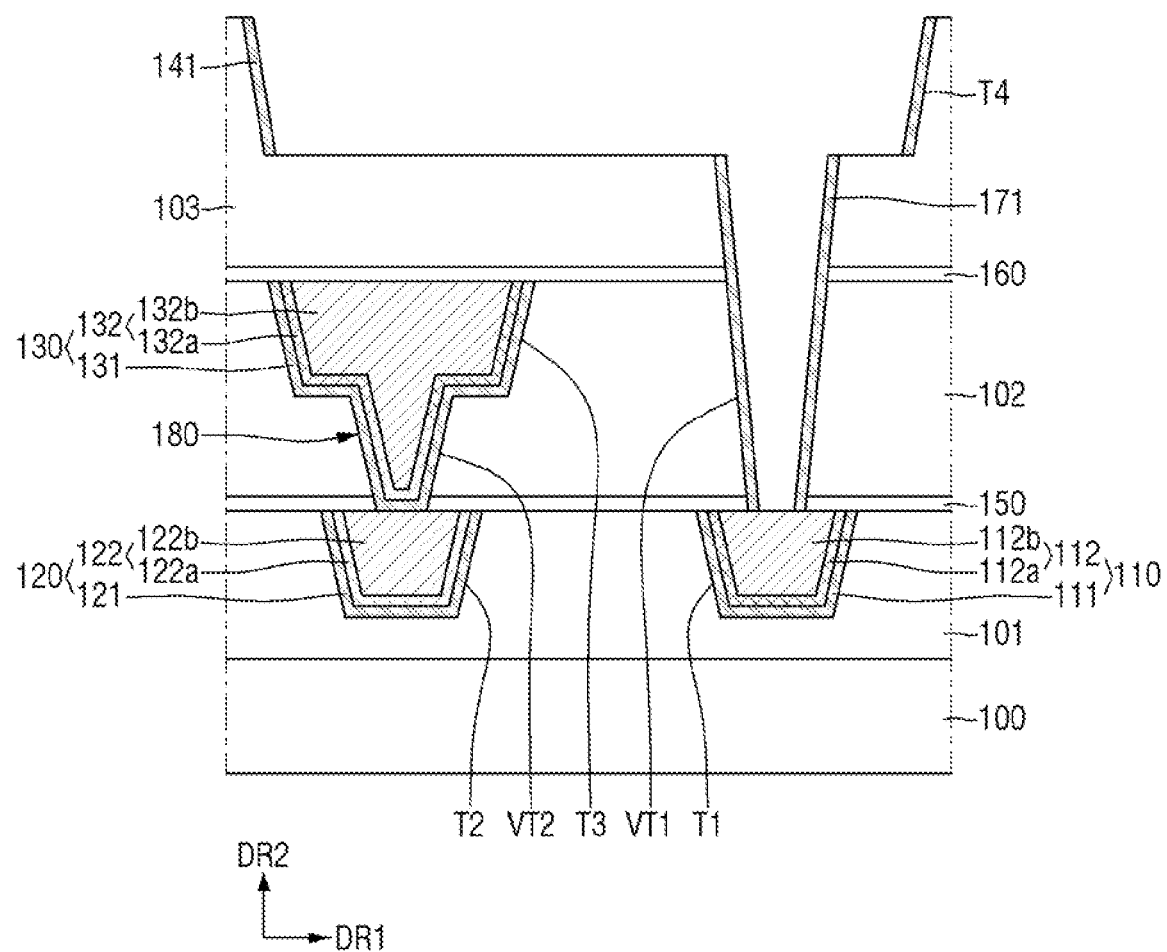

Referring to FIG. 9, the fourth wiring barrier layer 141 formed on the bottom surface of the fourth trench T4 may be removed. For example, at least a portion of the fourth wiring barrier layer 141 formed on the bottom surface of the fourth trench T4 may be removed. Accordingly, the third interlayer insulating layer 103 may be exposed on the bottom surface of the fourth trench T4. Further, the first via barrier layer 171 formed on the bottom surface of the first via trench VT1 may be removed. For example, at least a portion of the first via barrier layer 171 formed on the bottom surface of the fourth trench T4 may be removed. As a result, the first wiring pattern 110 may be exposed on the bottom surface of the first via trench VT1.

The fourth wiring barrier layer 141 formed on the bottom surface of the fourth trench T4 and the first via barrier layer 171 formed on the bottom surface of the first via trench VT1 may be removed through the same fabricating process.

Figure 10:
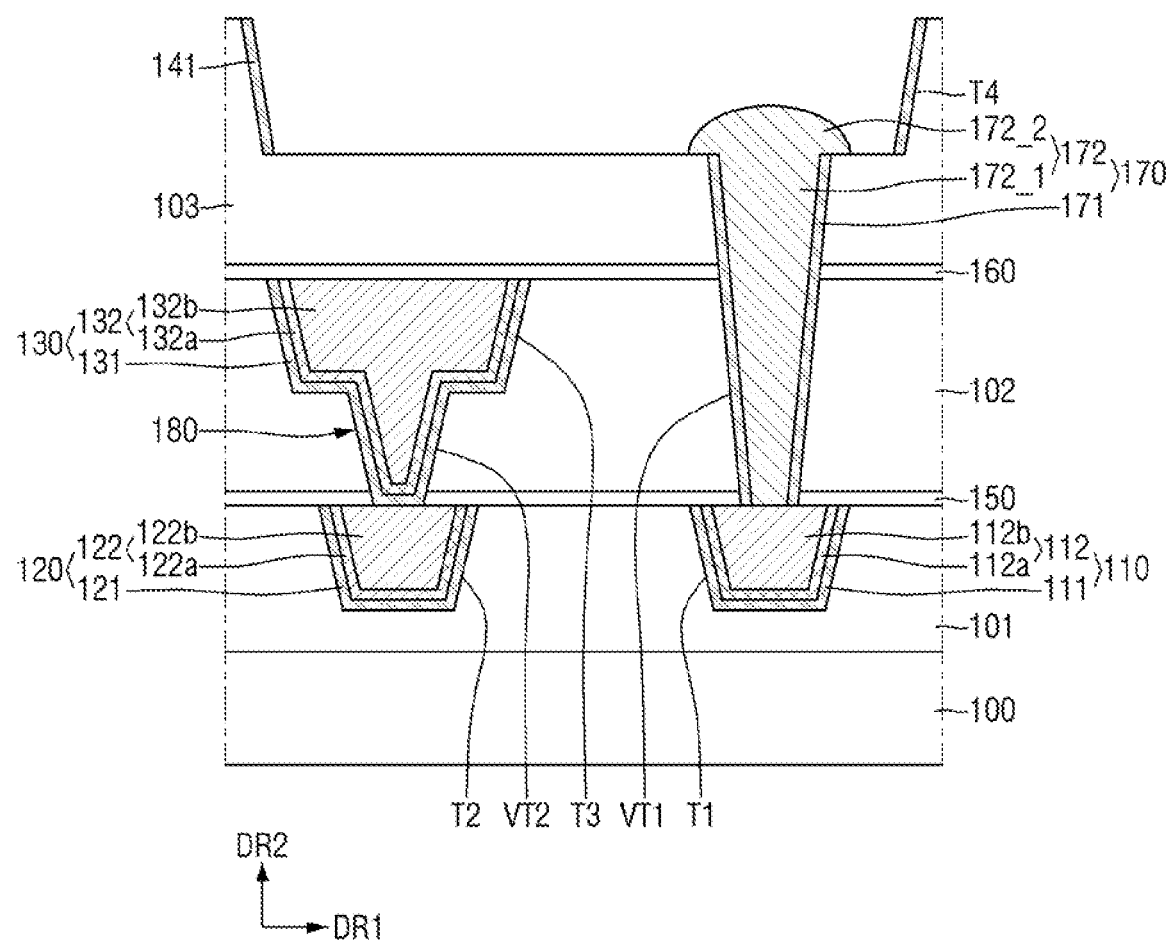

Referring to FIG. 10, the first via filling layer 172 may be formed to fill the inside of the first via trench VT1 on the first via barrier layer 171. The first portion 172_1 of the first via filling layer 172 may be formed inside the first via trench VT1. The first portion 172_1 of the first via filling layer 172 may be in contact with the first wiring pattern 110.

Further, the second portion 172_2 of the first via filling layer 172 may be formed to protrude into the fourth trench T4 on the first portion 172_1 of the first via filling layer 172. At least a part of the second portion 172_2 of the first via filling layer 172 may extend along the bottom surface of the fourth trench T4 in the horizontal direction DR1. For example, at least a part of the second portion 172_2 of the first via filling layer 172 may be formed on the bottom surface of the fourth trench T4 on both sides of the first via trench VT1. The width of the bottom surface of the second portion 172_2 of the first via filling layer 172 in the horizontal direction DR1 may be greater than the width the upper surface of the first via trench VT1 in the horizontal direction DR1.

Figure 11:
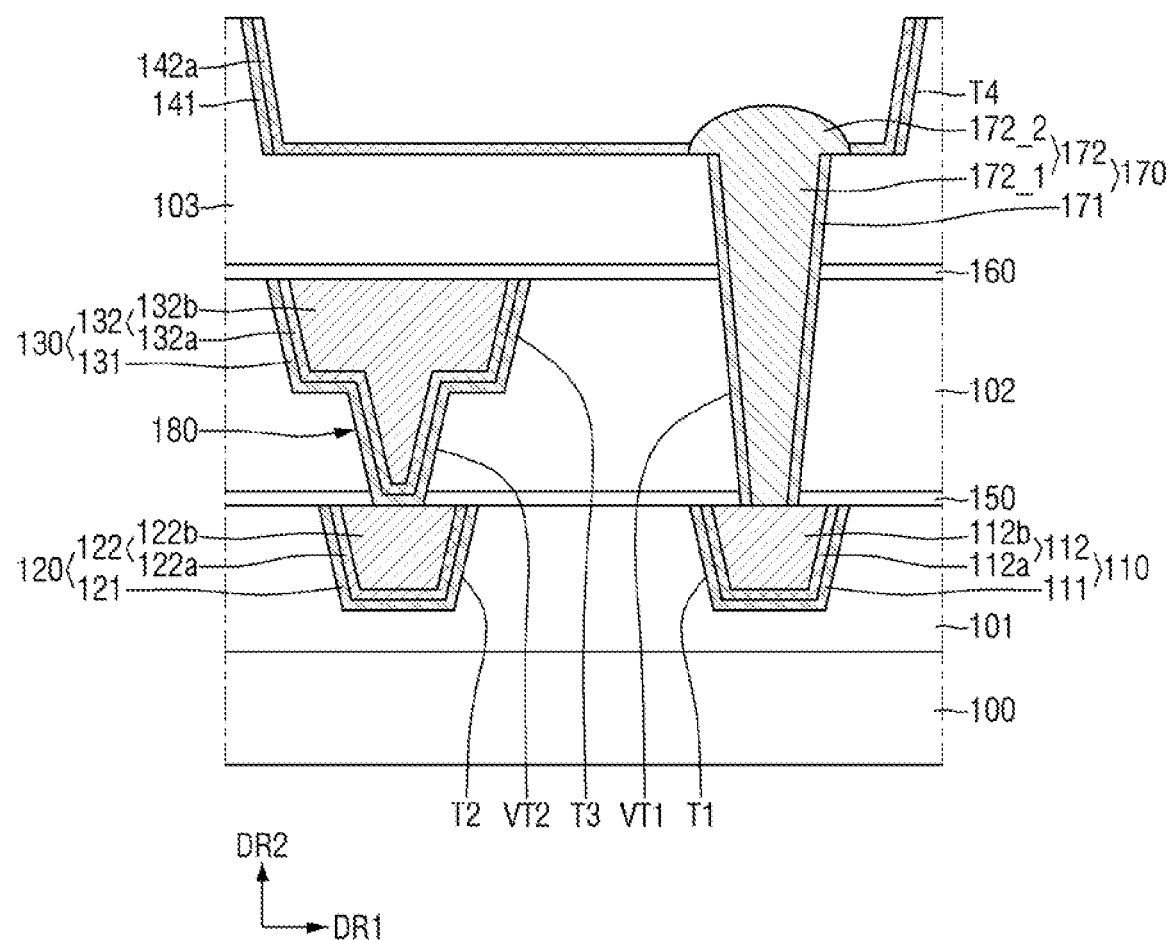

Referring to FIG. 11, a fourth liner layer 142a may be formed inside the fourth trench T4 along the side walls of the fourth wiring barrier layer 141 and the bottom surface of the fourth trench T4. The fourth liner layer 142a is not formed on the second portion 172_2 of the first via filling layer 172. For example, the second portion 172_2 of the first via filling layer 172 may be exposed by the fourth liner layer 142a. As another example, the second portion 172_2 of the first via filling layer 172 may be exposed by the fourth trench T4 on the fourth liner layer 142a. The fourth liner layer 142a may be in contact with the third interlayer insulating layer 103.

Referring to FIG. 1, a fourth filling layer 142b may be formed to fill the fourth trench T4, and may be disposed on the fourth liner layer 142a and the second portion 172_2 of the first via filling layer 172. The fourth filling layer 142b may be in contact with the second portion 172_2 of the first via filling layer 172. The semiconductor device shown in FIG. 1 may be fabricated through such a fabricating process.

Hereinafter, a semiconductor device according to an exemplary embodiment of the present inventive concept will be described referring to FIG. 12. Differences from the semiconductor device shown in FIGS. 1 and 2 will be mainly described, and thus, redundant descriptions of components may be omitted.

Figure 12:
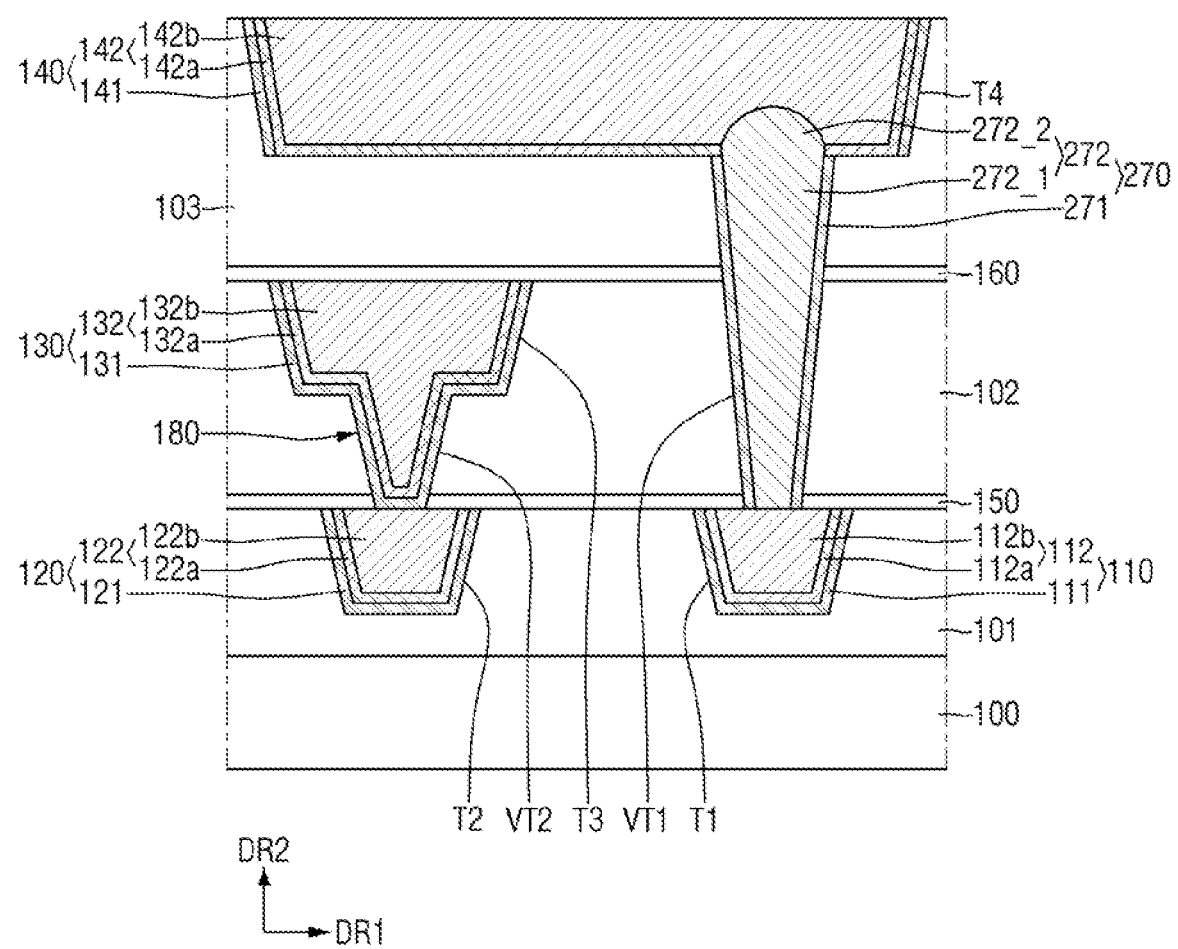
FIG. 12 is a diagram illustrating a semiconductor device according to an exemplary embodiment of the present inventive concept.

FIG. 12 is a diagram illustrating a semiconductor device according to an exemplary embodiment of the present inventive concept.

Referring to FIG. 12, in the semiconductor device according to an exemplary embodiment of the present inventive concept, a second portion 272_2 of a second via filling layer 272 of a first via 270 may overlap a first portion 272_1 of the second via filling layer 272 of the first via 270 in the vertical direction DR2. For example, the second portion 272_2 of the second via filling layer 272 does not protrude from the side walls of the first portion 272_1 of the second via filling layer 272 in the horizontal direction DR1. An uppermost surface of the first via barrier layer 271 may be in contact with the fourth liner layer 142a.

Hereinafter, a semiconductor device according to an exemplary embodiment of the present inventive concept will be described with reference to FIG. 13. Differences from the semiconductor device shown in FIGS. 1 and 2 will be mainly described, and thus, redundant descriptions of components may be omitted.

Figure 13:
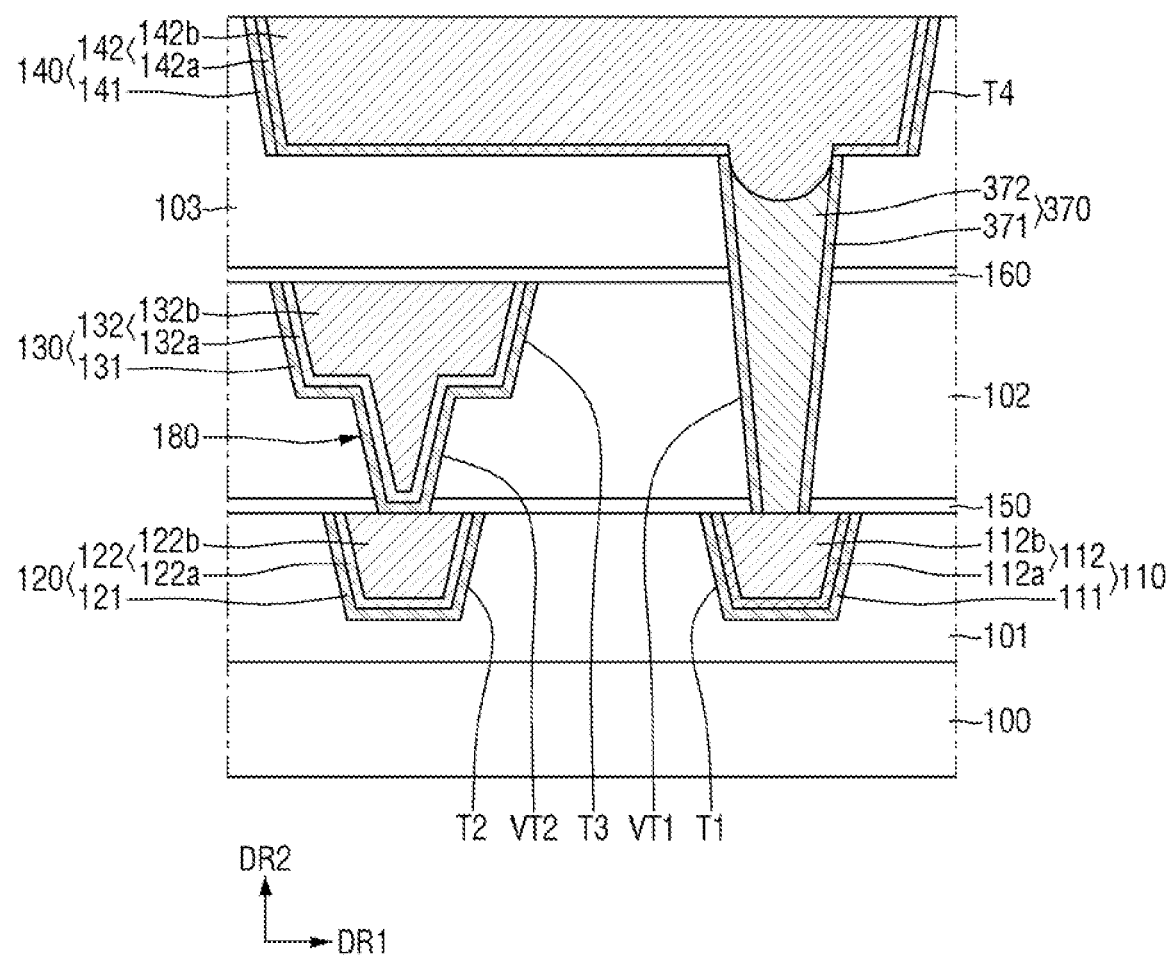
FIG. 13 is a diagram illustrating a semiconductor device according to an exemplary embodiment of the present inventive concept.

FIG. 13 is a diagram illustrating a semiconductor device according to an exemplary embodiment of the present inventive concept.

Referring to FIG. 13, in the semiconductor device according to an exemplary embodiment of the present inventive concept, an upper surface of a first via filling layer 372 of a first via 370 may be formed to be concave toward the substrate 100. At least a part of the fourth wiring filling layer 142 may be disposed inside the first via trench VT1. For example, at least a part of the fourth filling layer 142b may be disposed inside the first via trench VT1. For example, the fourth filling layer 142b may be disposed on the concave surface of the first via filling layer 372.

The fourth filling layer 142b may be in contact with the first via filling layer 372 inside the first via trench VT1. An uppermost surface of the first via barrier layer 371 may be in contact with the fourth liner layer 142a.

Hereinafter, a semiconductor device according to an exemplary embodiment of the present inventive concept will be described with reference to FIGS. 14 and 15. Differences from the semiconductor device shown in FIGS. 1 and 2 will be mainly described, and thus, redundant descriptions of components may be omitted.

Figure 14:
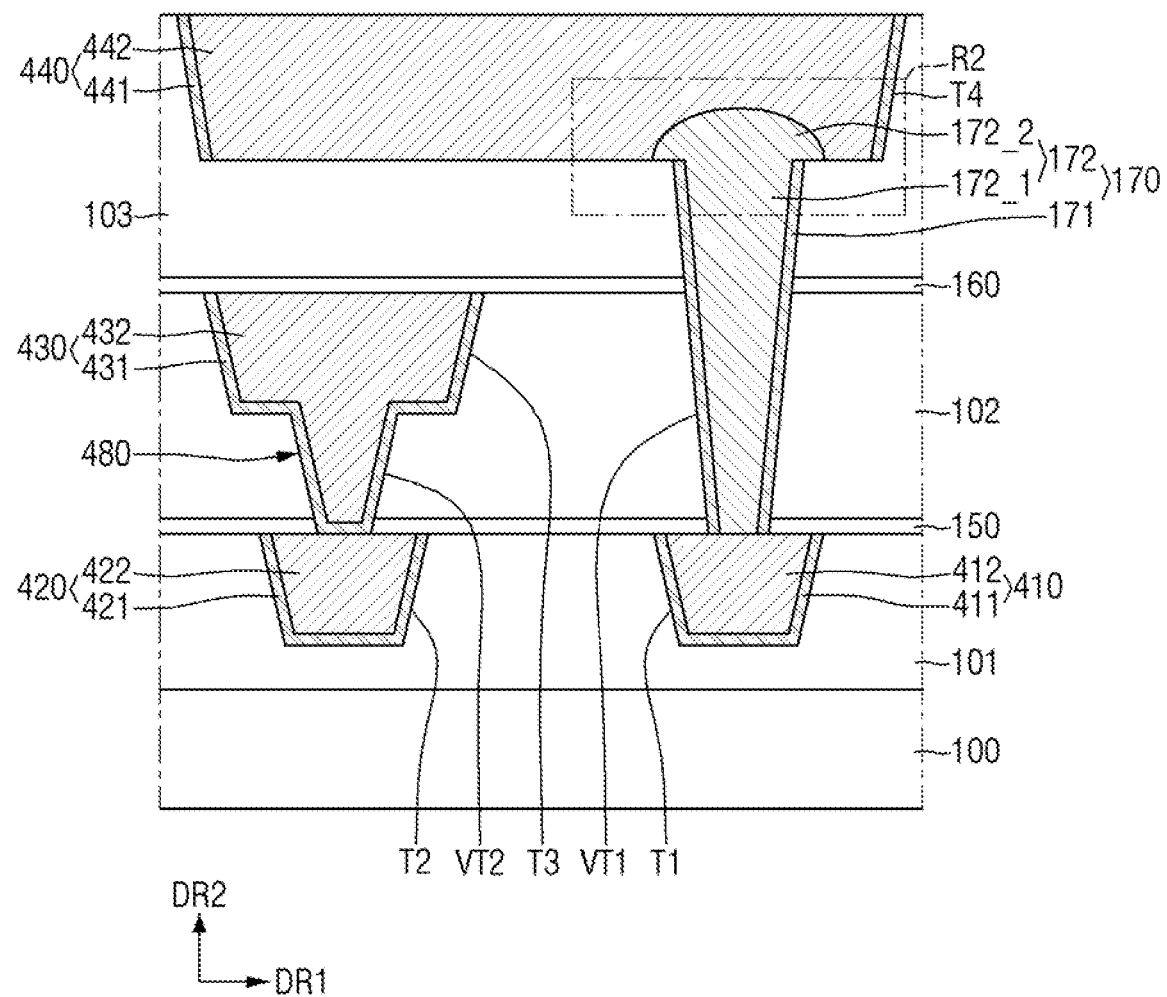
FIG. 14 is a diagram illustrating a semiconductor device according to an exemplary embodiment of the present inventive concept.

FIG. 14 is a diagram illustrating a semiconductor device according to an exemplary embodiment of the present inventive concept. FIG. 15 is an enlarged view of a region R2 of FIG. 14.

Figure 15:
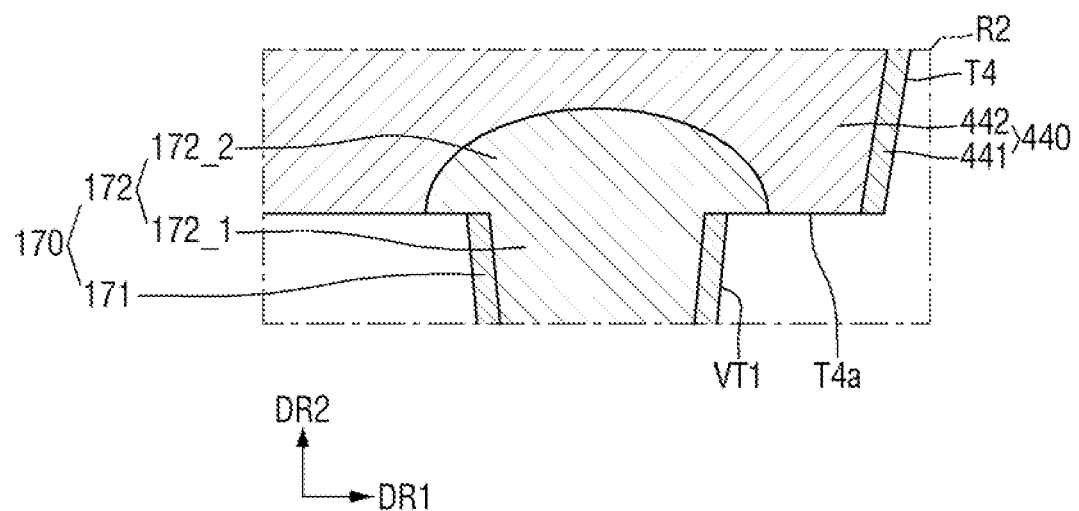
FIG. 15 is an enlarged view of a region R2 of FIG. 16.

Referring to FIGS. 14 and 15, in the semiconductor device according to an exemplary embodiment of the present inventive concept, a first wiring filling layer 412, a second wiring filling layer 422, a third wiring filling layer 432, and a fourth wiring filling layer 442 may each be formed by a single film.

For example, the first wiring pattern 410 may include a first wiring barrier layer 411 disposed along the side walls and the bottom surface of the first trench T1, and a first wiring filling layer 412 that fills the first trench T1 and is disposed on the first wiring barrier layer 411. The second wiring pattern 420 may include a second wiring barrier layer 421 disposed along the side walls and bottom surface of the second trench T2, and a second wiring filling layer 422 that fills the second trench T2 and is disposed on the second wiring barrier layer 421. The third wiring pattern 430 may include a third wiring barrier layer 431 disposed along the side walls and bottom surface of the third trench T3, and a third wiring filling layer 432 that fills the third trench T3 and is disposed on the third wiring barrier layer 431. The fourth wiring pattern 440 may include a fourth wiring barrier layer 441 disposed along the side walls and on the bottom surface of the fourth trench T4, and a fourth wiring filling layer 442 that fills the fourth trench T4 and is disposed on the fourth wiring barrier layer 441.

A second via 480 may include a third wiring barrier layer 431 disposed along the side walls and bottom surface of the second via trench VT2, and a third wiring filling layer 432 that fills the second via trench VT2 and is disposed on the third wiring barrier layer 431.

Hereinafter, a semiconductor device according to an exemplary embodiment of the present inventive concept will be described with reference to FIGS. 16 and 17. Differences from the semiconductor device shown in FIGS. 1 and 2 will be mainly described, and thus, redundant descriptions of components may be omitted.

Figure 16:
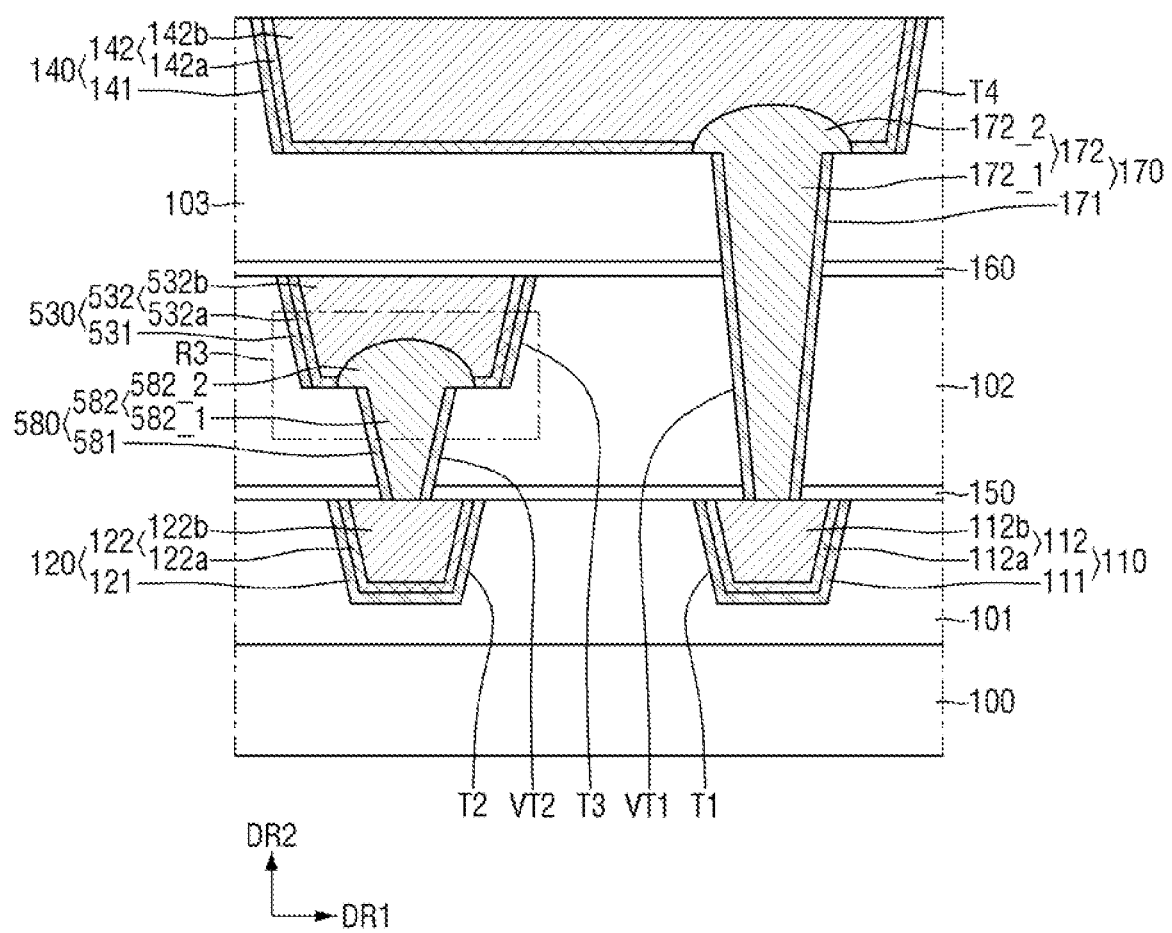
FIG. 16 is a diagram illustrating a semiconductor device according to an exemplary embodiment of the present inventive.

FIG. 16 is a diagram illustrating a semiconductor device according to an exemplary embodiment of the present inventive concept. FIG. 17 is an enlarged view of a region R3 of FIG. 16.

Figure 17:
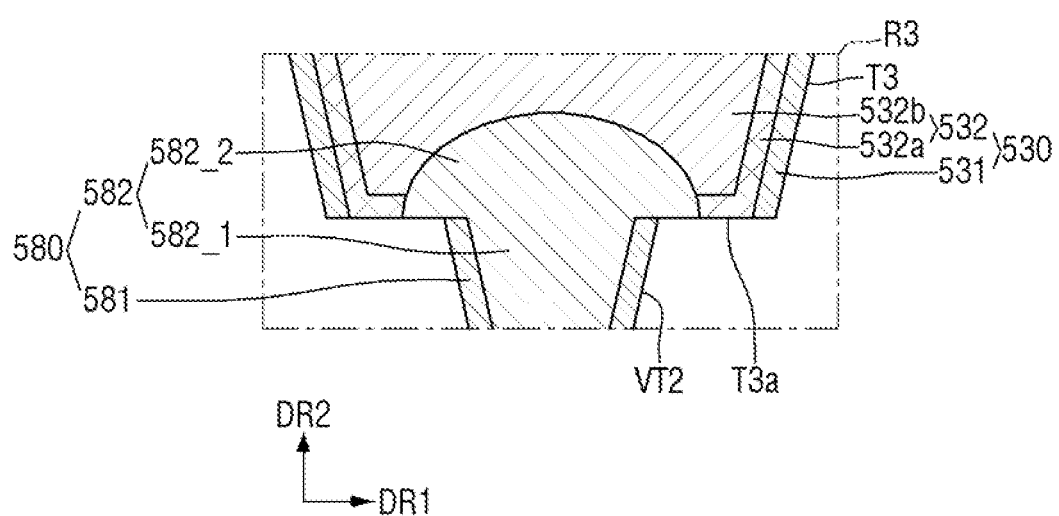
FIG. 17 is an enlarged view of a region R2 of FIG. 14.

Referring to FIGS. 16 and 17, in the semiconductor device according to an exemplary embodiment of the present inventive concept, a part of the second via 580 may protrude into the third trench T3. For example, an upper surface of a part of the second via 580 protruding into the third trench T3 may be formed to be higher than a bottom surface T3a of the third trench T3.

The third wiring pattern 530 may include a third wiring barrier layer 531 disposed along the side walls of the third trench T3, and a third wiring filling layer 532 that fills the third trench T3 and is disposed on the third wiring barrier layer 531. The third wiring filling layer 532 may include a third liner layer 532a and a third filling layer 532b.

The third liner layer 532a may be disposed along the side walls of the third wiring barrier layer 531 and the bottom surface T3a of the third trench T3. The third filling layer 532b may fill the third trench T3 and may be disposed on the third liner layer 532a. The third liner layer 532a may be in contact with the second interlayer insulating layer 102 on both sides of the second via trench VT2.

The second via 580 may include a second via barrier layer 581 and a second via filling layer 582. The second via barrier layer 581 may be disposed along the side walls of the second via trench VT2. For example, the second via barrier layer 581 may be conformally disposed in the second via trench VT2. For example, the second via barrier layer 581 may include the same material as the third wiring barrier layer 531. The second via barrier layer 581 may include, for example, at least one of cobalt (Co), ruthenium (Ru) and/or tantalum (Ta). However, the present inventive concept is not limited thereto.

The second via filling layer 582 may fill the second via trench VT2 and may be disposed on the second via barrier layer 581. A part of the second via filling layer 582 may be disposed inside the third trench T3. The second via filling layer 582 may include a first portion 582_1 disposed inside the second via trench VT2, and a second portion 582_2 disposed inside the third trench T3. The second portion 582_2 of the second via filling layer 582 may be a portion that protrudes into the third trench T3. A bottom surface of the first portion 582_1 of the second via filling layer 582 may be in contact with the second wiring pattern 120. An upper surface of the second portion 582_2 of the second via filling layer 582 may be in contact with the third filling layer 532b.

At least a part of the second portion 582_2 of the second via filling layer 582 may protrude in the horizontal direction DR1 beyond the first portion 582_1 of the second via filling layer 582. A bottom surface of a part of the second portion 582_2 of the second via filling layer 582 protruding beyond the first portion 582_1 of the second via filling layer 582 in the horizontal direction DR1 may be in contact with each of the uppermost surface of the second via barrier layer 581 and the second interlayer insulating layer 102.

A width of the bottom surface of the second portion 582_2 of the second via filling layer 582 in the horizontal direction DR1 may be greater than a width of the upper surface of the first portion 582_1 of the second via filling layer 582 in the horizontal direction DR1.

Hereinafter, a semiconductor device according to an exemplary embodiment of the present inventive concept will be described with reference to FIGS. 18 and 19. Differences from the semiconductor device shown in FIGS. 14 and 15 will be mainly described, and thus, redundant descriptions of components may be omitted.

Figure 18:
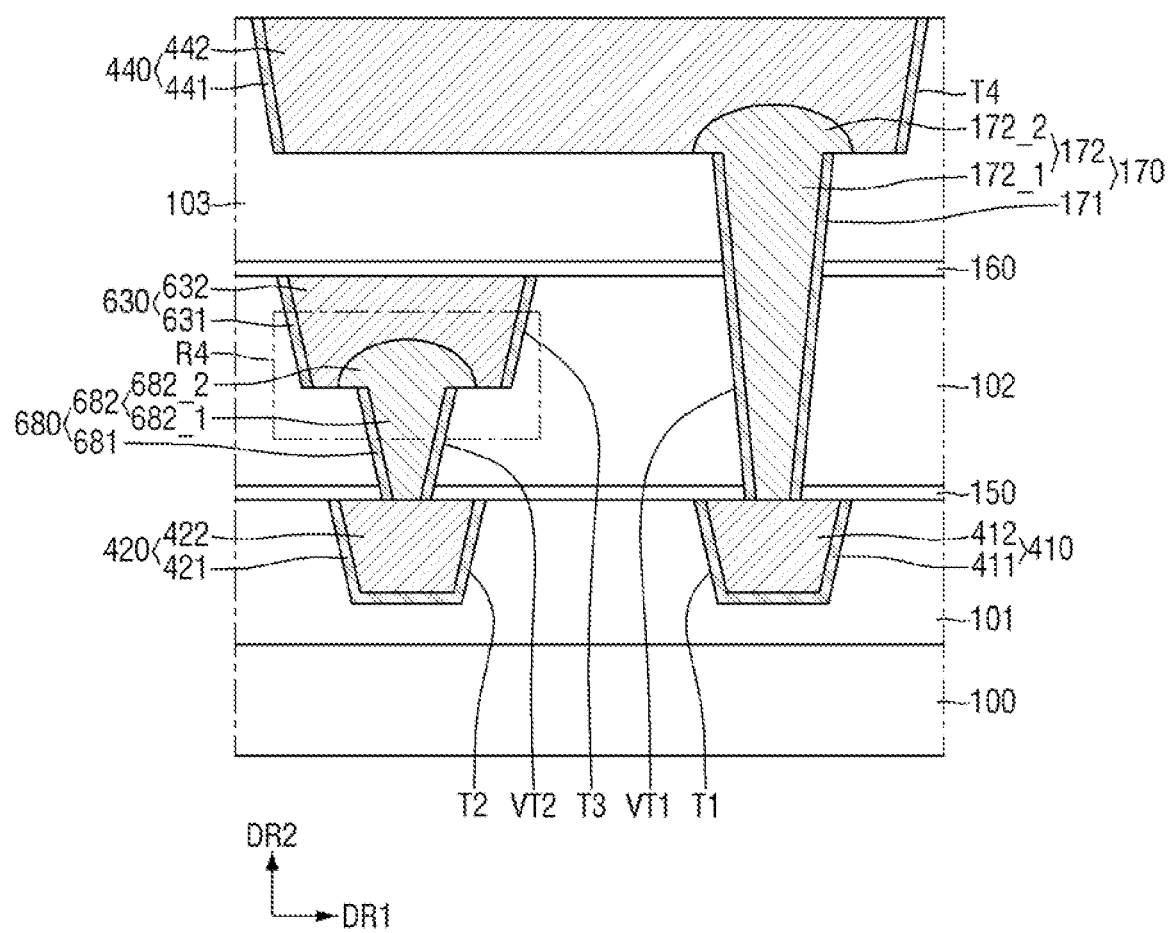
FIG. 18 is a diagram illustrating a semiconductor device according to an exemplary embodiment of the present inventive concept.

FIG. 18 is a diagram illustrating a semiconductor device according to an exemplary embodiment of the present inventive concept. FIG. 19 is an enlarged view of a region R4 of FIG. 18.

Figure 19:
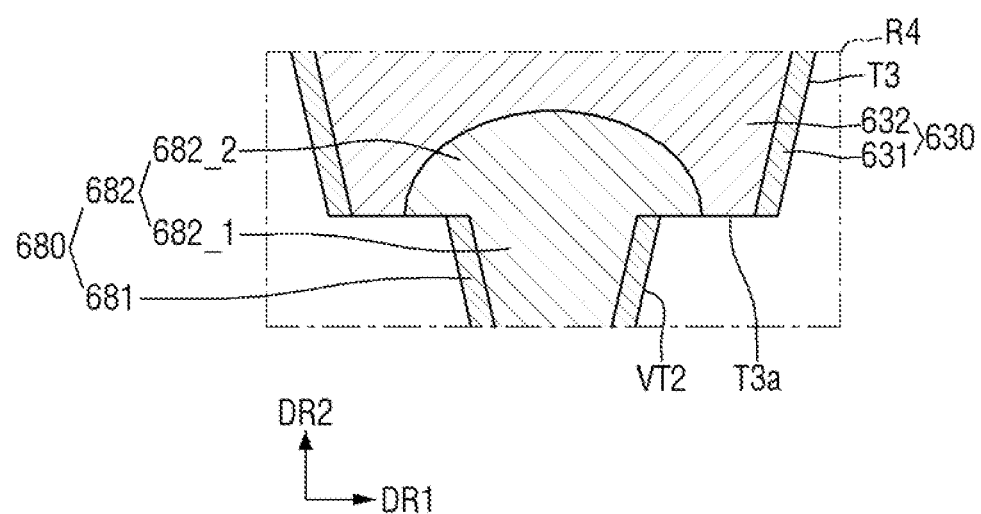
FIG. 19 is an enlarged view of a region R4 of FIG. 18.

Referring to FIGS. 18 and 19, in the semiconductor device according to an exemplary embodiment of the present inventive concept, a part of a second via 680 may protrude into the third trench T3. For example, an upper surface of a part of the second via 680 protruding into the third trench T3 may be formed to be higher than the bottom surface T3a of the third trench T3.

A third wiring pattern 630 may include a third wiring barrier layer 631 disposed along the side walls of the third trench T3, and a third wiring filling layer 632 that fills the third trench T3 and may be disposed on the third wiring barrier layer 631. The third wiring filling layer 632 may be in contact with the second interlayer insulating layer 102 on both sides of the second via trench VT2.

The second via 680 may include a second via barrier layer 681 and a second via filling layer 682. The second via barrier layer 681 may be disposed along the side walls of the second via trench VT2. For example, the second via barrier layer 681 may be conformally disposed in the second via trench VT2. For example, the second via barrier layer 681 may include the same material as the third wiring barrier layer 631. The second via barrier layer 681 may include, for example, at least one of cobalt (Co), ruthenium (Ru) and/or tantalum (Ta). However, the present inventive concept is not limited thereto.

The second via filling layer 682 may fill the second via trench VT2 and may be disposed on the second via barrier layer 681. A part of the second via filling layer 682 may be disposed inside the third trench T3. The second via filling layer 682 may include a first portion 682_1 disposed inside the second via trench VT2, and a second portion 682_2 disposed inside the third trench T3. The second portion 682_2 of the second via filling layer 682 may be a portion that protrudes into the third trench T3. A bottom surface of the first portion 682_1 of the second via filling layer 682 may be in contact with the second wiring pattern 420. An upper surface of the second portion 682_2 of the second via filling layer 682 may be in contact with the third wiring filling layer 632.

At least a part of the second portion 682_2 of the second via filling layer 682 may protrude in the horizontal direction DR1 beyond the first portion 682_1 of the second via filling layer 682. The bottom surface of a part of the second portion 682_2 of the second via filling layer 682 protruding in the horizontal direction DR1 beyond the first portion 682_1 of the second via filling layer 682 may be in contact with each of the uppermost surface of the second via barrier layer 681 and the second interlayer insulating layer 102.

A width of the bottom surface of the second portion 682_2 of the second via filling layer 682 in the horizontal direction DR1 may be greater than a width of the upper surface (or, e.g., an upper portion) of the first portion 682_1 of the second via filling layer 682 in the horizontal width DR1.

An exemplary embodiment of the present inventive concept provides a semiconductor device in which resistance between a via and a lower wiring pattern may be reduced by forming a via filling layer, which is included in the via, to be in contact with the lower wiring pattern.

In addition, an exemplary embodiment of the present inventive concept provides a semiconductor device in which the resistance between a via and an upper wiring pattern may be reduced by forming a via filling layer, which is included in the via, to be in contact with a filling layer included in the upper wiring pattern.

While the present inventive concept has been described with reference to exemplary embodiments thereof, it will be understood by those of ordinary skill in the art that various changes in form and details may be made thereto without departing from the spirit and scope of the present invention.

What is claimed is:

1. A semiconductor device comprising:
a substrate;
a first interlayer insulating layer disposed on the substrate;
a first wiring pattern disposed in a first trench formed in the first interlayer insulating layer;
a second interlayer insulating layer disposed on the first interlayer insulating layer;
a second wiring pattern disposed in a second trench formed in the second interlayer insulating layer;
a third interlayer insulating layer disposed on the second interlayer insulating layer;
a third wiring pattern disposed in a third trench formed in the third interlayer insulating layer, and including a first wiring barrier layer and a first wiring filling layer, wherein the first wiring barrier layer is disposed along side walls of the third trench, wherein the first wiring filling layer fills the third trench and is disposed on the first wiring barrier layer, wherein a bottom surface of the first wiring filling layer is in contact with the third interlayer insulating layer;
a first via trench extending from an upper surface of the first wiring pattern to a bottom surface of the third trench in a first direction; and
a first via including a first via barrier layer and a first via filling layer, wherein the first via barrier layer is disposed along side walls of the first via trench, wherein the first via filling layer fills the first via trench and is disposed on the first via barrier layer, wherein the first via filling layer is in contact with each of the first wiring pattern and the first wiring filling layer,
wherein the first wiring filling layer and the first via filling layer include different materials from each other.

2. The semiconductor device of claim 1, wherein the first wiring filling layer includes:
a first liner layer disposed along side walls of the first wiring barrier layer and a bottom surface of the third trench; and
a first filling layer filling the third trench and disposed on the first liner layer and in contact with the first via filling layer.

3. The semiconductor device of claim 1, wherein the first via filling layer includes
a first portion disposed inside the first via trench; and
a second portion protruding into the third trench and connected to the first portion of the first via trench.

4. The semiconductor device of claim 3, wherein at least a part of a bottom surface of the second portion of the first via filling layer is in contact with the third interlayer insulating layer.

5. The semiconductor device of claim 1, further comprising:
a first etching stop layer disposed between the first interlayer insulating layer and the second interlayer insulating layer; and
a second etching stop layer disposed between the second interlayer insulating layer and the third interlayer insulating layer.

6. The semiconductor device of claim 1, wherein at least a part of the first wiring filling layer is disposed in the first via trench.

7. The semiconductor device of claim 1, wherein the first wiring filling layer is formed of a single film.

8. The semiconductor device of claim 1, wherein the second wiring pattern is spaced apart from the first via in a second direction crossing the first direction.

9. The semiconductor device of claim 1, further comprising:
a fourth wiring pattern disposed in a fourth trench formed in the first interlayer insulating layer and spaced apart from the first wiring pattern in a second direction crossing the first direction;
a second via trench extending from an upper surface of the fourth wiring pattern to a bottom surface of the second trench in the first direction; and
a second via including a second via barrier layer and a second via filling layer, wherein the second via barrier layer is disposed along side walls of the second via trench, and the second via filling layer fills the second via trench and is disposed on the second via barrier layer,
wherein the second wiring pattern includes a second wiring barrier layer and a second wiring filling layer, wherein the second wiring barrier layer is disposed along side walls of the second trench, and the second wiring filling layer fills the second trench and is disposed on the second wiring barrier layer,
wherein a bottom surface of the second wiring filling layer is in contact with the second interlayer insulating layer,
wherein the second via filling layer is in contact with each of the fourth wiring pattern and the second wiring filling layer, and
wherein the second wiring filling layer and the second via filling layer include different materials from each other.

10. The semiconductor device of claim 9, wherein the second wiring filling layer comprises
a second liner layer disposed along side walls of the second wiring barrier layer and the bottom surface of the second trench; and
a second filling layer filling the second trench and disposed on the second liner layer and the second via filling layer.

11. The semiconductor device of claim 9, wherein the second via filling layer includes:
a first portion disposed in the second via trench; and
a second portion protruding into the second trench and connected to the first portion of the second via filling layer.

12. A semiconductor device comprising:
a substrate;
a first interlayer insulating layer disposed on the substrate;
a first wiring pattern disposed in a first trench formed in the first interlayer insulating layer;
a first etching stop layer disposed on the first interlayer insulating layer;
a second interlayer insulating layer disposed on the first etching stop layer;
a second etching stop layer disposed on the second interlayer insulating layer;
a third interlayer insulating layer disposed on the second etching stop layer;
a second wiring pattern disposed in a second trench formed in the third interlayer insulating layer, and including a wiring barrier layer, a liner layer, and a filling layer, wherein the wiring barrier layer is disposed along side walls of the second trench, wherein the liner layer is disposed along side walls of the wiring barrier layer and a bottom surface of the second trench, wherein the filling layer fills the second trench and is disposed on the liner layer, and wherein the liner layer is in contact with the third interlayer insulating layer;
a via trench extending from an upper surface of the first wiring pattern to the bottom surface of the second trench in a vertical direction; and
a via including a via barrier layer and a via filling layer, wherein the via barrier layer is disposed along side walls of the via trench, wherein the via filling layer fills the via trench and is disposed on the via barrier layer, and wherein the via filling layer is in contact with each of the first wiring pattern and the filling layer,
wherein the filling layer and the via filling layer include different materials from each other.

13. The semiconductor device of claim 12, wherein the via filling layer includes:
a first portion disposed in the via trench; and
a second portion protruding into the second trench and connected to the first portion of the via trench.

14. The semiconductor device of claim 13, wherein at least a part of a bottom surface of the second portion of the via filling layer is in contact with the third interlayer insulating layer.

15. The semiconductor device of claim 12, wherein an uppermost surface of the via barrier layer is in contact with the liner layer.

16. The semiconductor device of claim 12, further comprising:
   a third wiring pattern disposed in a third trench formed in the second interlayer insulating layer and spaced apart from the via in a horizontal direction.

* * * * *